(12) United States Patent
Fujisawa et al.

(10) Patent No.: US 7,585,597 B2
(45) Date of Patent: Sep. 8, 2009

(54) MASK PATTERN DATA GENERATING METHOD, PHOTO MASK MANUFACTURING METHOD, AND SEMICONDUCTOR DEVICE MANUFACTURING METHOD

(75) Inventors: Tadahito Fujisawa, Tokyo (JP); Takeshi Ito, Yokohama (JP); Toshiya Kotani, Machida (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 716 days.

(21) Appl. No.: 11/259,069

(22) Filed: Oct. 27, 2005

(65) Prior Publication Data
US 2006/0093926 A1 May 4, 2006

(30) Foreign Application Priority Data
Oct. 29, 2004 (JP) .............................. 2004-316418

(51) Int. Cl.
*G03F 1/00* (2006.01)
(52) U.S. Cl. ........................................................ 430/5
(58) Field of Classification Search .................... 430/5, 430/22, 394; 716/19, 20, 21
See application file for complete search history.

(56) References Cited

U.S. PATENT DOCUMENTS
2004/0248045 A1* 12/2004 Tanaka et al. ............... 430/312

FOREIGN PATENT DOCUMENTS

| JP | 03-170928 A | 7/1991 |
|---|---|---|
| JP | 06-313964 | 11/1994 |
| JP | 07-140639 | 6/1995 |
| KR | 2000-0075841 | 12/2000 |

OTHER PUBLICATIONS

Notification for Filing Opinion from the Korean Intellectual Property Office, mailed Sep. 27, 2006, in Korean Patent Application No. 10-2005-102386, and English translation thereof.

* cited by examiner

*Primary Examiner*—Stephen Rosasco
(74) *Attorney, Agent, or Firm*—Finnegan, Henderson, Farabow, Garrett & Dunner, L.L.P.

(57) ABSTRACT

A mask pattern data generating method is disclosed, which comprises preparing mask pattern data which corresponds to a design pattern including a pair of line patterns formed of two line patterns, and disposing an auxiliary pattern which is un-transferable to a resist film at a center of a space region between the pair of line patterns, in which the disposing of the auxiliary pattern includes obtaining a shape of the auxiliary pattern which meets formulae in which a width in the short edge direction of the auxiliary pattern, a space width between the auxiliary pattern and one of the pair of line patterns, a wavelength of an exposure light emitted by a projection aligner using a photo mask at exposure, and a numerical apertures of a projection lens of the projection aligner are defined as parameters, and disposing the obtained auxiliary pattern at the center of the space region.

20 Claims, 8 Drawing Sheets

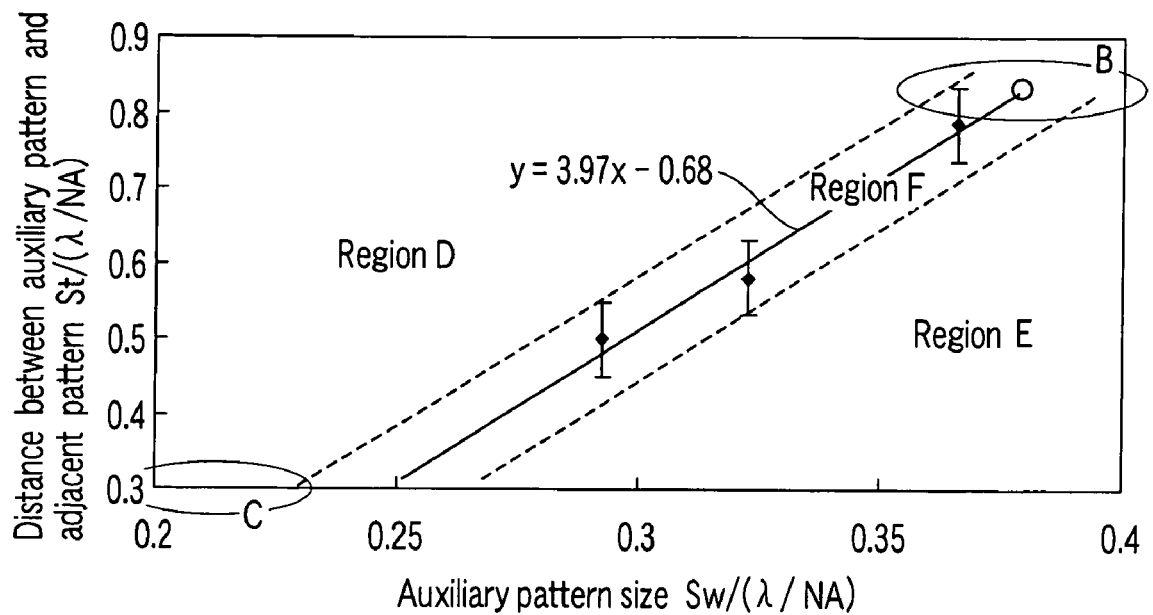
F I G. 12
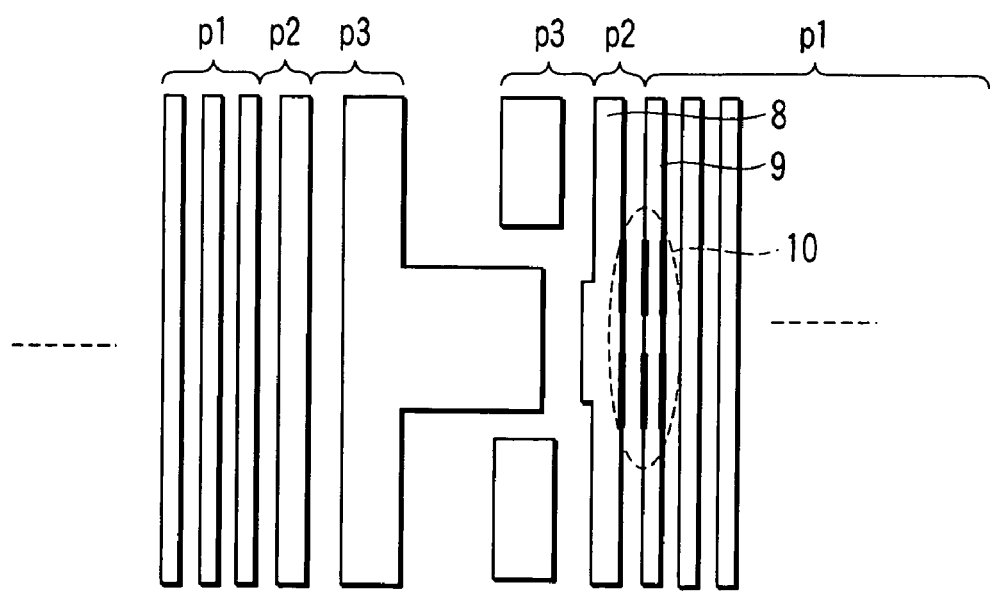
F I G. 13

MASK PATTERN DATA GENERATING METHOD, PHOTO MASK MANUFACTURING METHOD, AND SEMICONDUCTOR DEVICE MANUFACTURING METHOD

CROSS-REFERENCE TO RELATED APPLICATIONS

This application is based upon and claims the benefit of priority from prior Japanese Patent Application No. 2004-316418, filed Oct. 29, 2004, the entire contents of which are incorporated herein by reference.

BACKGROUND OF THE INVENTION

1. Field of the Invention

The present invention relates to a method of generating mask pattern data on a mask pattern to be transferred to a substrate, a method of manufacturing a photo mask, and a method of manufacturing a semiconductor device.

2. Description of the Related Art

With downsizing of a device pattern, there is a demand for obtaining a resolution close to a theoretical limit which depends on a wavelength of optical beam. To realize this demand, a variety of phase shift masks are proposed as masks. In addition, as an exposure method, there is proposed an oblique incidence illumination technique in which a light incident onto a mask is inclined from an optical axis by an angle which corresponds to the numerical aperture of an objection lens system of a projection exposure apparatus. There is proposed another exposure method in which a phase shift mask and an oblique incidence illumination are combined with each other.

Both of the phase shift mask and the oblique incidence illumination technique are intended to enhance a resolution by utilizing a phase difference between the adjacent patterns. With this technology, a high resolution can be obtained with respect to a highly periodic and simple pattern such as an L/S (Line-and-Space) pattern. However, a satisfactory resolution cannot be obtained with respect to a random pattern contained in a device pattern.

In recent years, there is proposed a mask obtained by arranging in a random pattern region an un-transferable auxiliary pattern which cannot be transferred on a substrate. Also, there is proposed an exposure method using the mask. For example, in Jpn. Pat. Appln. KOKAI Publication No. 7-140639, there is disclosed a mask for use in projection exposure using the oblique incidence illumination, wherein the mask includes a pattern to be transferred and an un-transferable pattern. In the case where the to-be-transferred pattern has periodicity (that is, in the case where the pattern is periodically arranged at a fixed pitch), an un-transferable auxiliary pattern or patterns are provided in such a manner that the periodicity is maintained. On the other hand, in the case where the to-be-transferred pattern does not have periodicity (that is, in the case where the pattern is arranged to be isolated), an un-transferable auxiliary pattern or patterns are provided in such a manner that a periodicity is imparted to the to-be-transferred pattern. When $\lambda$ is defined as a wavelength of the illumination light and NA is a numerical aperture of the projection lens, in the case where the to-be-transferred pattern formed of a light transmitting section (or a light shielding section) has a periodicity and a width of the to-be-transferred pattern is equal to or greater than $\lambda/2$ NA, one or more un-transferable auxiliary patterns formed of a light transmitting section (or a light shielding section) are provided, at pitches of $0.8 \times \lambda/2$ NA to $1.4 \times \lambda/2$ NA from an edge of the mask transmitting section (or a light shielding section), at an end of the periodic disposition of the to-be-transferred pattern. On the other hand, in the case where the to-be-transferred pattern formed of a light transmitting section has no-periodicity and is thus isolated, and a width of the to-be-transferred pattern is equal to or greater than $\lambda/2$ NA, one or more un-transferable auxiliary patterns formed of a light transmitting section (or a light shielding section) are provided, at pitches of $0.8 \times \lambda/2$ NA to $1.4 \times \lambda/2$ NA from an edge of the pattern, at one side or both sides of the to-be-transferred pattern.

In the above prior art disclosed in Jpn. Pat. Appln. KOKAI Publication No. 7-140639, in the case where the pattern is formed at one type of comparatively simple pitches, the technology is effective. However, an actual device, for example, a select gate and its vicinity of a NAND-type flash memory (FIGS. 1 and 13), comprises patterns with a variety of pitches: a region p1 of a pattern with a fine periodicity, a region p2 of a pattern adjacent to the region p1 and having a periodicity longer than that of the region p1, and a region p3 of a pattern whose periodicity is longer than that of the region p2. Patterns whose lithography margin is insufficient and which is to be provided with an auxiliary pattern are line patterns 11 and 12 in FIG. 1 and line patterns 11, 12 and 8 in FIG. 13. In the patterns shown in, for example, FIG. 13, when the oblique incidence illumination is used, a line width variation in edge portions E1 and E2 of the line patterns 11 and 12 having lowest periodicity is large.

With the conventional method of adding an auxiliary pattern, it is impossible to determine how the auxiliary pattern is deposited with respect to a pattern with a complicated arrangement such as the line pattern 11 or 12.

In addition, in the pattern of the select gate of the NAND-type flash memory, as shown in FIG. 13, a contact portion locally exists. In other words, a region having more non-periodic patterns than other pattern regions exists. Thus, a low-resolution problem occurs. With the patterns shown in FIG. 13, a sufficient resolution margin cannot be obtained with respect to a local portion 10 of the line patterns 8 and 9.

As described above, in the prior art of improving the margin by adding an un-transferable auxiliary pattern, it is impossible to determine how an auxiliary pattern should be disposed. Hence, there has not been successfully solved the low-margin problem in a pattern region which requires downsizing, in particular, in a non-periodic pattern region in a cell region of a device.

BRIEF SUMMARY OF THE INVENTION

According to an aspect of the present invention, there is provided a mask pattern data generating method of generating mask pattern data of a mask pattern to be depicted on a photo mask, based on a design pattern, for use in projection by an oblique incidence illumination, the method comprising:

preparing mask pattern data which corresponds to a design pattern including a pair of line patterns formed of two line patterns adjacent to each other in a short edge direction; and disposing an auxiliary pattern which is un-transferable to a resist film at a center portion of a space region between the pair of line patterns, in which the disposing of the auxiliary pattern includes obtaining a shape of the auxiliary pattern which meets formulae in which a width in the short edge direction of the auxiliary pattern, a space width between the auxiliary pattern and one of the pair of line patterns, a wavelength of an exposure light emitted by a projection aligner using a photo mask at exposure, and a numerical apertures of a projection lens of the projection aligner are defined as parameters, and disposing the obtained auxiliary pattern at the center portion of the space region between the pair of line patterns.

According to another aspect of the present invention, there is provided a photo mask manufacturing method of manufacturing a photo mask by using mask pattern data, in which the mask pattern data corresponds to a design pattern including a pair of line patterns formed of two line patterns adjacent to each other in a short edge direction; the mask pattern data is added with an auxiliary pattern which is un-transferable to a resist film; the auxiliary pattern is disposed at a center portion of a space region between the pair of line patterns; and the auxiliary pattern has a shape which meets formulae in which a width in the short edge direction of the auxiliary pattern, a space width between the auxiliary pattern and one of the pair of line patterns, a wavelength of an exposure light emitted by a projection aligner using a photo mask at exposure, and a numerical apertures of a projection lens of the projection aligner are defined as parameters.

According to a further aspect of the present invention, there is provided a semiconductor device manufacturing method of manufacturing a semiconductor device, by carrying out an oblique incidence illumination to a photo mask to project a pattern formed on the photo mask to a resist film formed on a substrate, in which the photo mask is manufactured by using mask pattern data corresponding to a design pattern including a pair of line patterns formed of two line patterns adjacent to each other in a short edge direction; the mask pattern data is added with an auxiliary pattern which is un-transferable to a resist film; the auxiliary pattern is disposed at a center portion of a space region between the pair of line patterns; and the auxiliary pattern has a shape which meets formulae in which a width in the short edge direction of the auxiliary pattern, a space width between the auxiliary pattern and one of the pair of line patterns, a wavelength of an exposure light emitted by a projection aligner using a photo mask at exposure, and a numerical apertures of a projection lens of the projection aligner are defined as parameters.

BRIEF DESCRIPTION OF THE SEVERAL VIEWS OF THE DRAWING

FIG. 12 is a diagram showing a relationship between the auxiliary pattern width Sw and a space width St (distance) Sd between the auxiliary pattern and the adjacent pattern, obtained in accordance with the first embodiment of the present invention;

FIG. 13 is a diagram showing a design pattern of a select gate and its vicinity of a NAND-type flash memory to be referred to in association with a second embodiment of the present invention;

DETAILED DESCRIPTION OF THE INVENTION

Hereinafter, embodiments of the present invention will be described with reference to the accompanying drawings.

First Embodiment

The inventors of the present application have invented a technique of adding an auxiliary pattern to a pattern in which the periodicity of pattern arrangement is lowered to affect the exposure margin, or adding an auxiliary pattern in accordance with a distance between a pattern edge and its adjacent pattern edge.

Specifically, the inventors of the present application focused attention to a portion of a line pattern of a select gate and its vicinity of a NAND-type flash memory, at which the exposure margin is lowered and the resolution is degraded.

Figure 1:
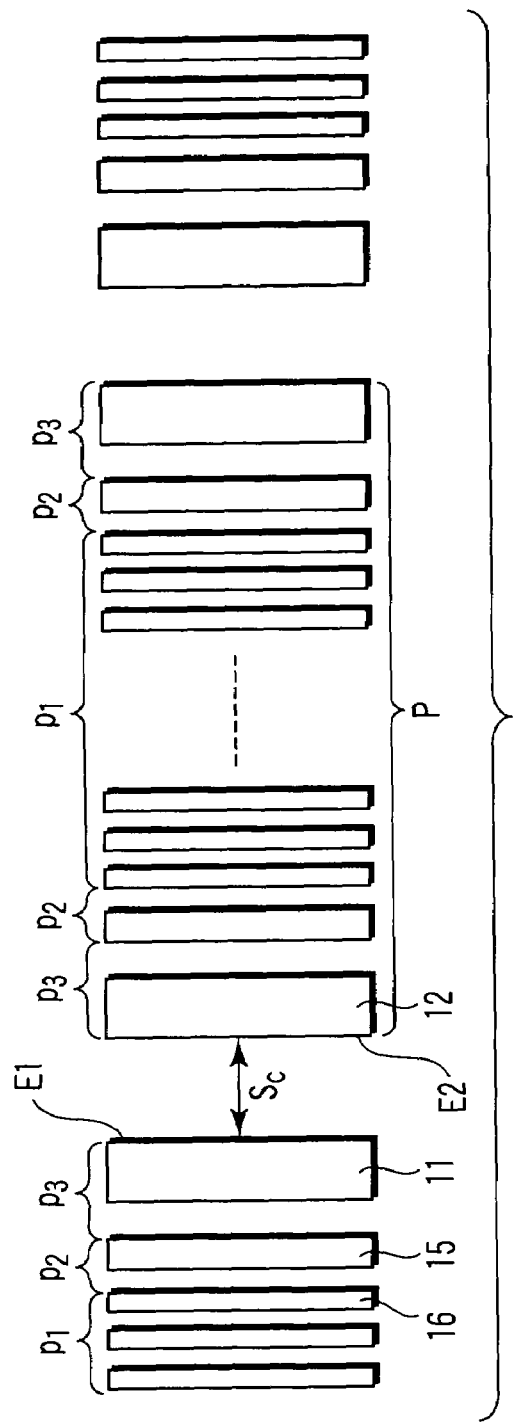
FIG. 1 is a diagram showing a design pattern of a select gate and its vicinity of a NAND-type flash memory to be referred to in association with a first embodiment of the present invention.

FIG. 1 is a design pattern of a select gate and its vicinity of a NAND-type flash memory.

In the line pattern of the select gate and its vicinity of a NAND type flash memory, as shown in FIG. 1, there exist a pattern region p1, a pattern region p2 adjacent to the pattern p1, and a pattern region p3 adjacent to the pattern p2. In the pattern region p1, line patterns are repeatedly disposed at a small pattern pitch, and there is a demand for the severest design rule with regard to the pattern shown in FIG. 1. The line patterns repeatedly disposed at the small pitch in the pattern region p1 correspond to patterns of series-connected memory cells of the NAND type flash memory. In the pattern region p2, only one line pattern is disposed at a pattern pitch which is slightly greater than the pattern pitch in the pattern region p1. There is some case where some line patterns are repeatedly disposed in the pattern region p2. In the pattern region p3, only one line pattern is disposed at a pattern pitch which is significantly greater than the pattern pitch in the pattern region p1. In the pattern region p3, two line patterns may be repeatedly disposed. The line patterns including the pattern region p1, the pattern region p2, and the pattern region p3 are repeatedly disposed at a further greater pitch P, with a space width Sc between the line patterns. In this case, there has been a problem that an exposure margin is lowered with respect to the line patterns in the regions p2 and p3.

In the present embodiment, with respect to such a complicated device pattern, there has been invented a technique of adding an auxiliary pattern for ensuring a required exposure margin while taking consideration so that a design rule of the size of the auxiliary pattern becomes not extremely sever from the viewpoint of manufacturing a mask.

A detailed description will be described below by way of example of a pattern of a select gate and its vicinity of the NAND-type flash memory cells shown in FIG. 1.

Figure 2:
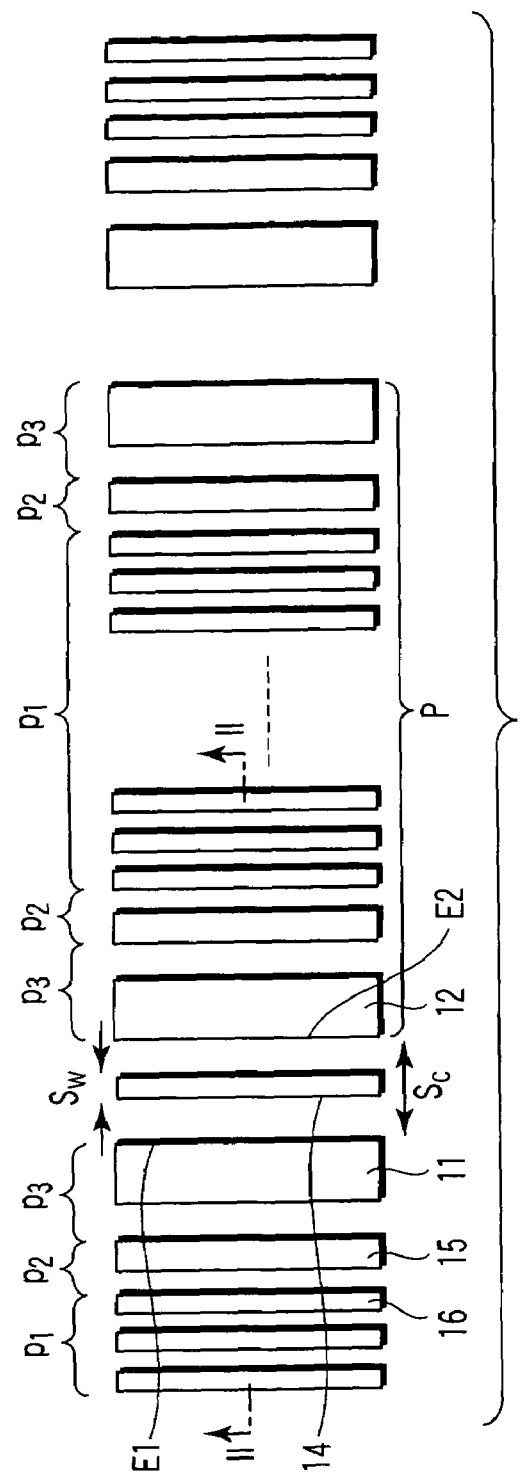
FIG. 2 is a diagram showing a pattern in which an auxiliary pattern 14 has been disposed with respect to the design pattern shown in FIG. 1.

FIG. 2 shows an example of adding to the pattern shown in FIG. 1 an auxiliary pattern according to the present embodiment. In FIG. 2, the L/S patterns (Line/Space pattern) of the region p1 have a pitch of 140 nm (L/S=70 nm/70 nm), and are repeatedly arranged. The L/S pattern of the region p2 has a pitch of 164 nm (L/S=82 nm/82 nm), and is singly, not repeatedly, disposed. The L/S pattern of the region p3 has a pitch of 290 nm (L/S=200 nm/90 nm), and is singly, not repeatedly, disposed. A width of a region between the adjacent NAND-type flash memory cells, i.e., width Sc of the space between the region p3 of a NAND-type flash memory cell and the region p3 of a NAND-type flash memory cell adjacent to that NAND-type flash memory cell is Sc=335 nm.

It is problematic that the exposure margin of the line patterns 11 and 12 is small. In particular, there is a problem that a line width variation of edges E1 and E2 in the line patterns 11 and 12 is large.

In order to solve these problems, the inventors of the present application added an un-transferable auxiliary pattern 14 having a width Sw in a space of the width Sc, which is not transferred to a resist film by exposure. The auxiliary pattern 14 is disposed at the center of the space between the line pattern 11 and the line pattern 12.

Figure 3:
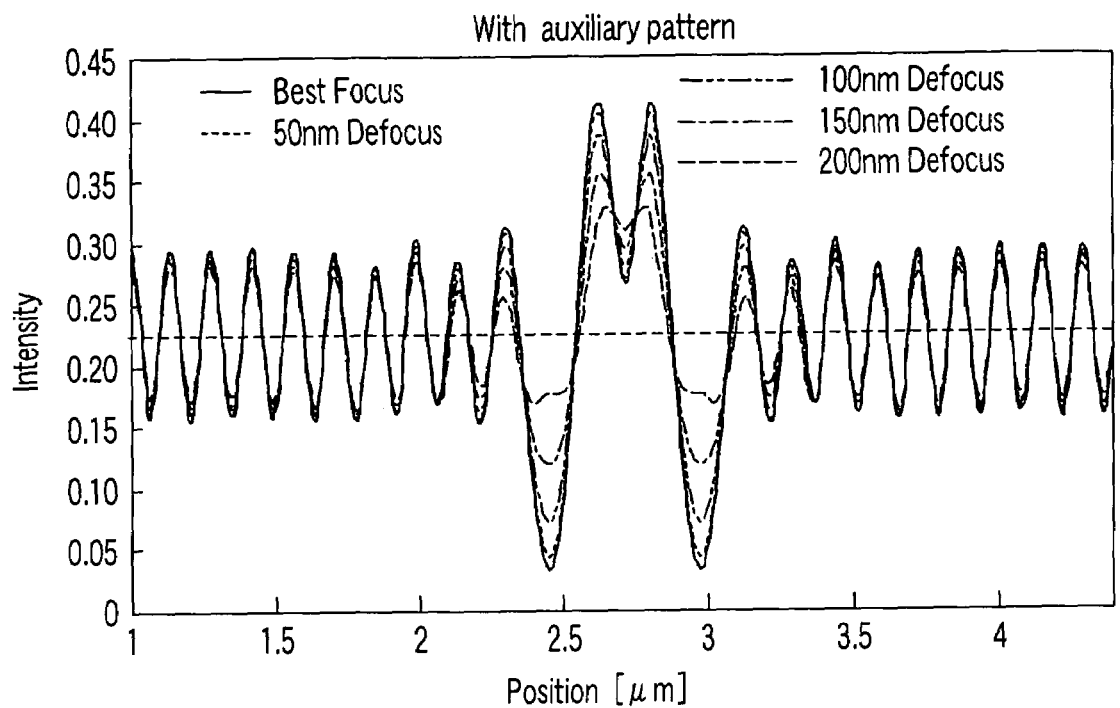
FIG. 3 is a characteristic diagram showing a defocus dependency of an image intensity taken along the line II-II of a pattern shown in FIG. 2 in which the auxiliary pattern 14 is arranged.
Figure 4:
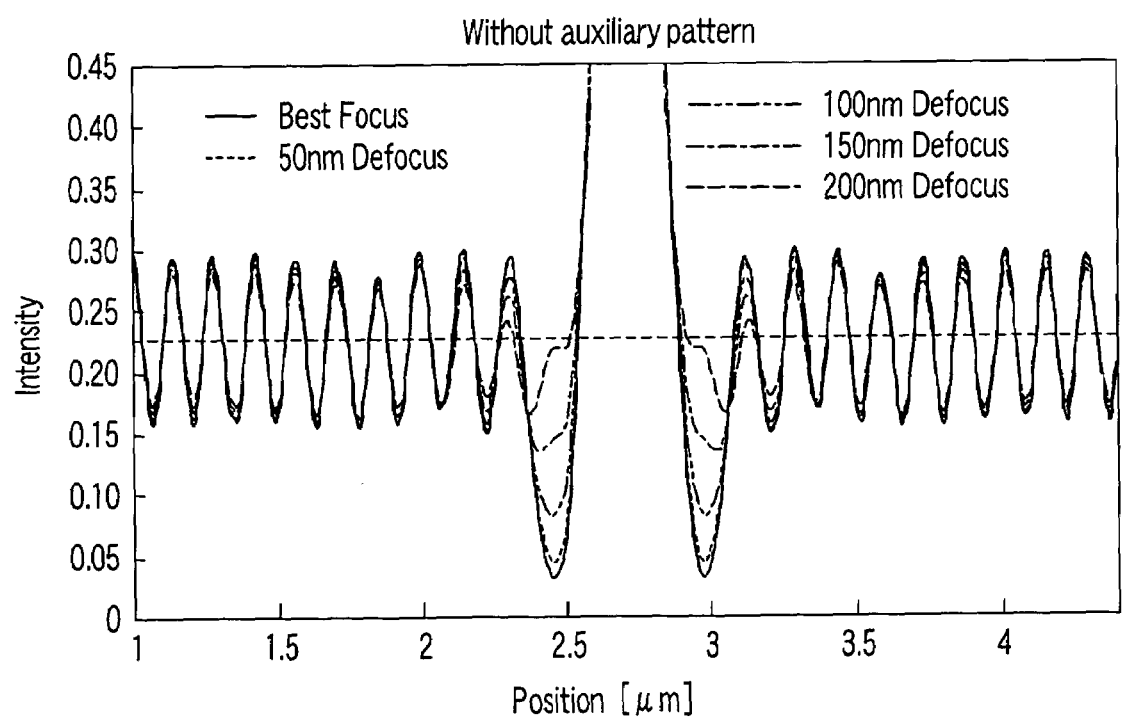
FIG. 4 is a characteristic diagram used as a reference to the characteristic diagram shown in FIG. 3, which shows a defocus dependency of an image intensity taken along the line II-II of the pattern shown in FIG. 2 in the case where the auxiliary pattern 14 is not arranged in the pattern of FIG. 2.
Figure 5:
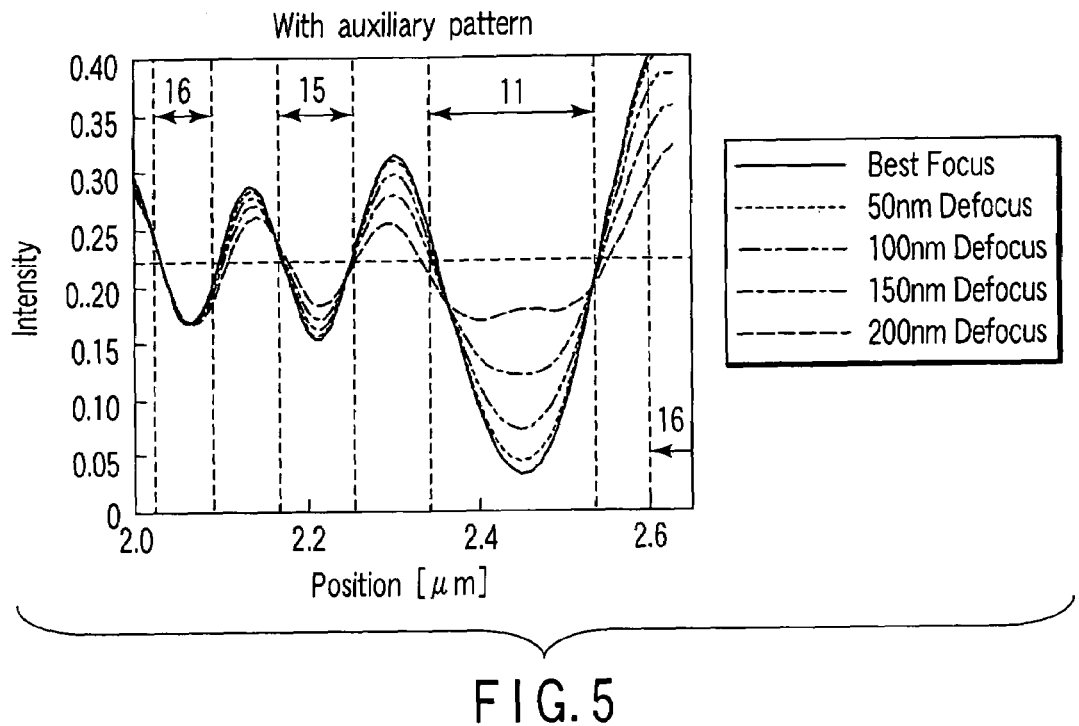
FIG. 5 is a characteristic diagram showing a defocus dependency of an image intensity of a specific portion, i.e., a select gate portion, taken along the line II-II of the pattern shown in FIG. 2 in which the auxiliary pattern 14 is arranged.
Figure 6:
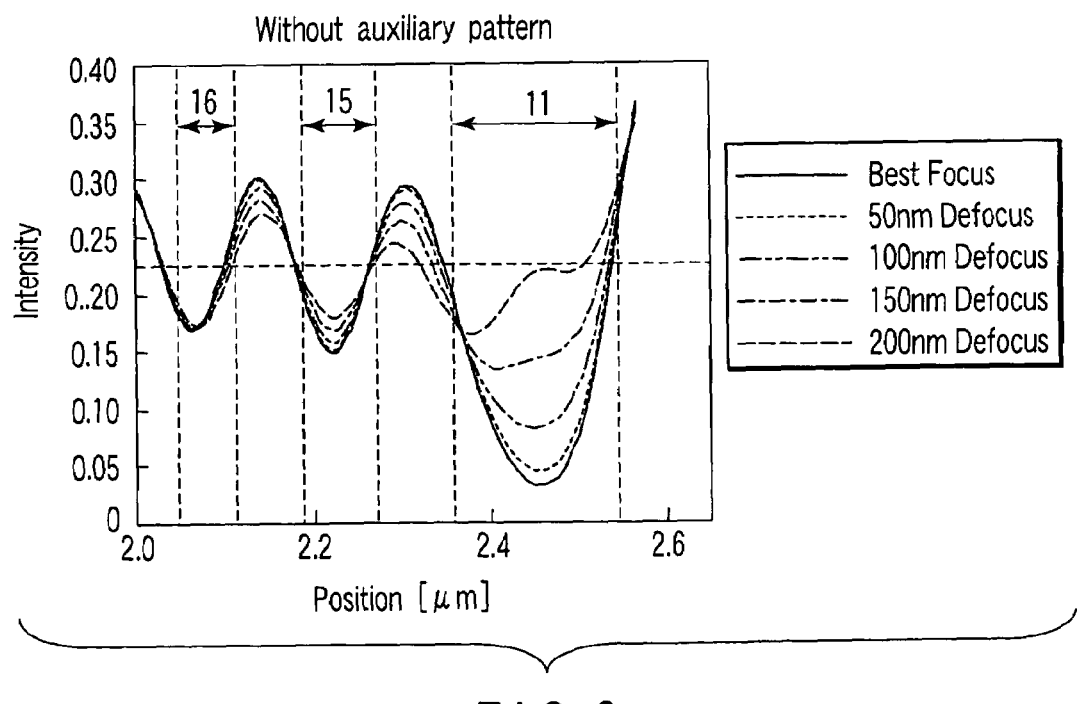
FIG. 6 is a characteristic diagram used as a reference to the characteristic diagram shown in FIG. 5, which shows a defocus dependency of an image intensity in a specific portion, i.e., a select gate portion, taken along the line II-II of the pattern shown in FIG. 2 in the case where the auxiliary pattern is not arranged in the pattern of FIG. 2.

FIG. 3 shows characteristics indicating a defocus dependency of an image intensity taken along the line II-II shown in FIG. 2 showing a NAND cell pattern in which an auxiliary pattern is disposed. FIG. 4 shows, as a reference against the characteristic diagram shown in FIG. 3, a characteristic diagram indicating a defocus dependency of an image intensity taken along the line II-II shown in FIG. 2 showing a NAND cell pattern in the case where no auxiliary pattern is disposed. In addition, FIG. 5 shows an enlarged diagram showing a portion of the characteristic diagram of the defocus dependency of the image intensity shown in FIG. 3, which portion corresponds to a select gate portion of the NAND cell pattern. FIG. 6 shows, as a reference against the characteristic diagram shown in FIG. 5, an enlarged diagram showing a portion of the characteristic diagram of the defocus dependency of the image intensity shown in FIG. 4, which portion corresponds to a select gate portion of the NAND cell pattern.

Figure 7:
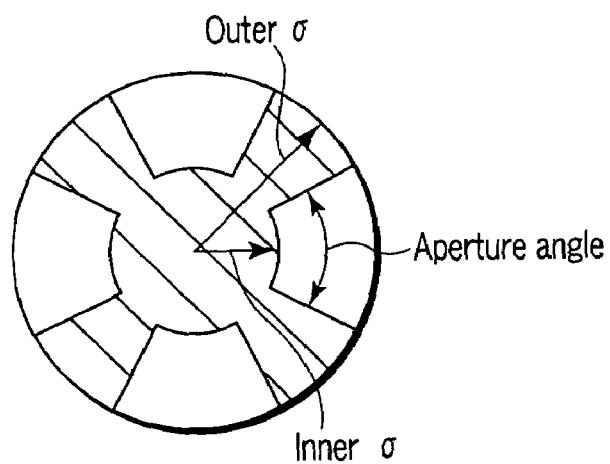
FIG. 7 is a diagram showing a light source used in the first embodiment of the present invention, in which four fan-shaped light portions are symmetrically disposed.

The width Sw of the auxiliary pattern 14 applied in the embodiment is 75 nm, and the auxiliary pattern 14 is disposed at the center of the space width Sc. In addition, an optical condition for exposure is such that exposure light is an ArF excimer laser beam, an exposure wavelength $\lambda$ is $\lambda$=193 nm, and a numerical apertures NA=0.83. An illumination condition is such that use is made of a light source, as shown in FIG. 7, having a fan-shaped light portion which is symmetrical in four directions, in consideration of importance of the resolution of a fine pattern in a direction of 0 degree and in a direction of 90 degrees (inner $\sigma$=0.7, outer $\sigma$=0.9, and fan aperture angle of 40 degrees). In addition, $\Delta L$=40 nm is defined with respect to $\Delta L$ indicating a blurring quantity of an optical image serving as a process factor.

Here, the boundary line indicated by the broken line shown in FIGS. 3, 4, 5 and 6 indicates an exposure intensity (edge optical intensity) for resolving an L/S pattern (L/S=70 nm/70 nm) in the region p1 of the NAND cell pattern. It is desirable that, with respect to this boundary line, the image intensity at the light portion is high and the image resolution at the dark portion is low.

It should be noted that, from the characteristic diagram shown in FIG. 3, a condition is established such that the auxiliary pattern is not transferred to a resist film although the size Sw of the auxiliary pattern is 75 nm which is greater than a design rule (specifically, p1/2=70 nm) of a cell portion. Further, when comparison is made among the characteristic diagrams of FIGS. 3, 4, 5 and 6, it is found that the lowering of the image intensity of a portion corresponding to the line pattern 11 at the dark portion is significantly improved by disposing the auxiliary pattern 14. In addition, the lowering of the image intensity in the space between the line pattern 11 and a line pattern 15 shown in FIG. 2 can also be suppressed, thus improving a total margin of the select gate portion.

Next, the inventors of the present application have studied a condition of an auxiliary pattern width Sw and a space width St between the auxiliary pattern and its adjacent line pattern in order to obtain a specific design rule on the auxiliary pattern disposed in a cell region which requires downsizing of the device pattern as shown in FIG. 1. In the device pattern, in many cases, a condition is defined depending on a portion at which its periodicity is lost. Therefore, an attempt was made to attain a condition that an auxiliary pattern is not transferred, including a local pattern region shown in FIG. 8. A detailed description will be described below.

Figure 8:
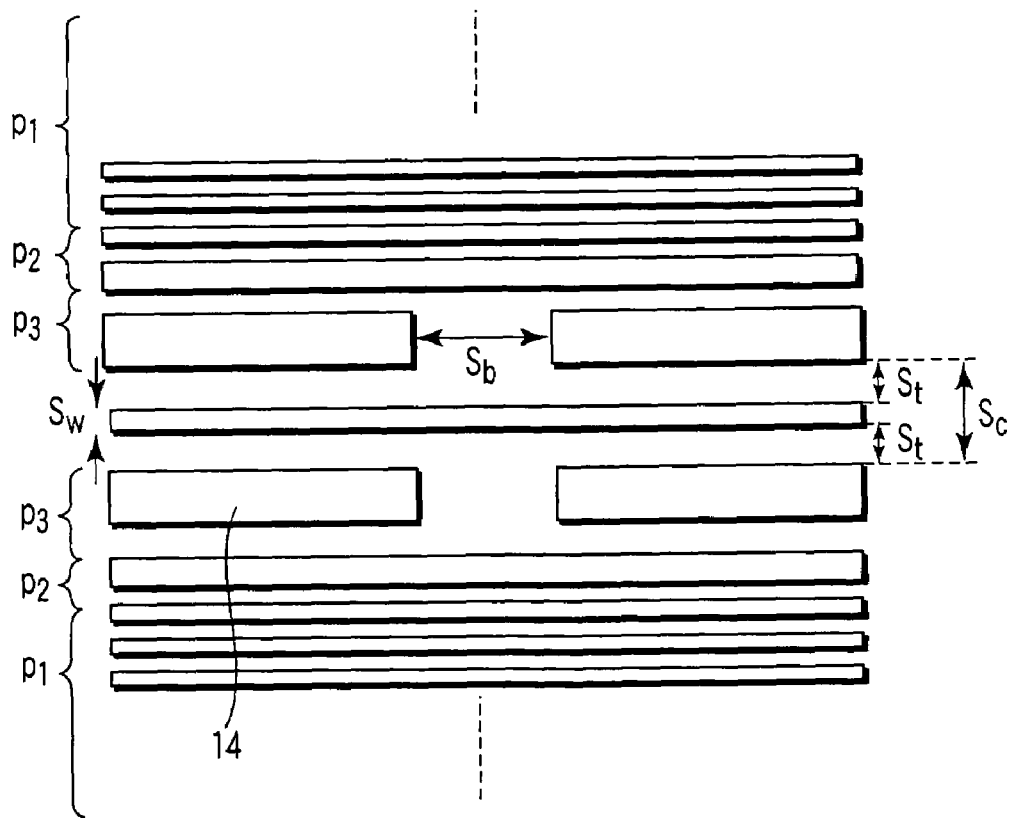
FIG. 8 is a diagram showing a pattern disposition used for obtaining a disposition rule of an auxiliary pattern according to the first embodiment of the present invention.

FIG. 8 shows a pattern used for obtaining a disposition rule of an auxiliary pattern. The pattern shown in FIG. 8 differs from the design pattern shown in FIG. 1 in that the line patterns 11 and 12 are broken on the midway thereof to provide a space of a width Sb=750 nm. With the pattern shown in FIG. 8, an auxiliary pattern is transferred more easily than with the pattern disposition shown in FIG. 2. The inventors of the present application carried out an exposure simulation, while changing the space width St between the auxiliary pattern and its adjacent line pattern and the width Sw of the short edge of the auxiliary pattern. This simulation was carried out under the same condition as that used for obtaining the characteristics shown in FIGS. 3, 4, 5 and 6.

Figure 9:
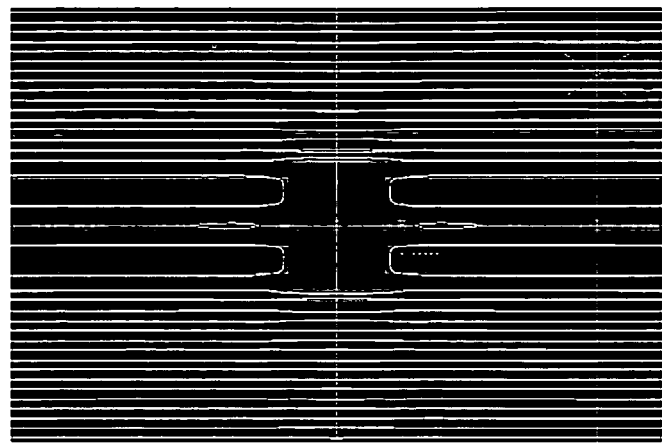
FIG. 9 shows a simulation image of a pattern shown in FIG. 8, obtained by transfer when an auxiliary pattern width Sw=70 nm in the pattern shown in FIG. 8.
Figure 10:
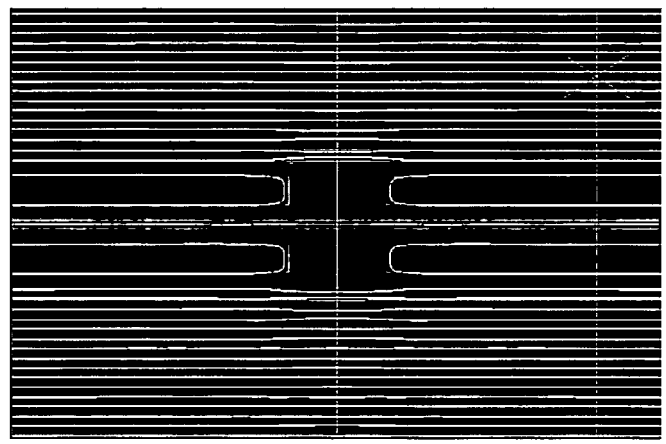
FIG. 10 shows a simulation image of a pattern shown in FIG. 8, obtained by transfer when an auxiliary pattern width Sw=68 nm in the pattern shown in FIG. 8.
Figure 11:
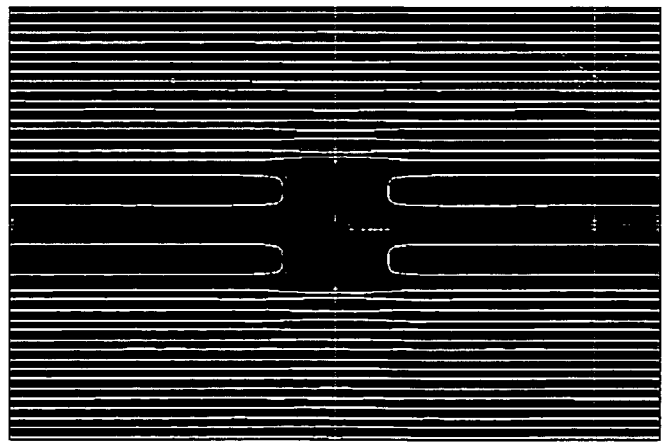
FIG. 11 shows a simulation image of a pattern shown in FIG. 8, obtained by transfer when an auxiliary pattern width Sw=65 nm in the pattern shown in FIG. 8.

FIGS. 9 to 11 show a simulation result of an influence due to the pattern region shown in FIG. 8 on an auxiliary pattern of the width Sw when the mask pattern is exposed. FIGS. 9 to 11 show the results when Sw=70 nm, Sw=68 nm, and Sw=65 nm, respectively. That is, FIG. 9 shows a simulation image of a pattern shown in FIG. 8, obtained when an auxiliary pattern width Sw=70 nm in the pattern shown in FIG. 8. FIG. 10 shows a simulation image of a pattern shown in FIG. 8, obtained when an auxiliary pattern width Sw=68 nm in the pattern shown in FIG. 8. FIG. 11 shows a simulation image of a pattern shown in FIG. 8, obtained when an auxiliary pattern width Sw=65 nm in the pattern shown in FIG. 8. In FIGS. 9 to 11, white solid line indicates a resist pattern image at an exposure dose of Just dose ±10%, Just dose denoting a dose by which L/S=70 nm/70 nm is obtained so that the cell portion of the region p1 is desirably formed at Just Focus and thus as designed. Here, the space width Sc is 300 nm.

From these simulation results, it is found that, at a portion at which the line pattern 11 and the line pattern 12 have their periodicity, an auxiliary pattern is not transferred to a resist film even when the auxiliary pattern width Sw is any of Sw=70 nm, Sw=68 nm, and Sw=65 nm. It is also found that, even at a portion at which the periodicity is lost, the auxiliary pattern is not transferred in the case where the auxiliary pattern width Sw=65 nm. However, it is found that, at a portion at which the periodicity is lost, the auxiliary pattern is transferred to the resist film in the case where the auxiliary pattern width Sw is 70 nm or 68 nm. Namely, these simulation results show that it is necessary to determine the auxiliary pattern width Sw, taking the pattern line periodicity into consideration. However, in consideration of a correlation between an actually carried out exposure test and the above simulation results, it has been confirmed that a resist film whose width is smaller than 20 nm formed on a substrate by exposure is removed from the surface of the substrate by a developing process. Thus, it is determined that an auxiliary pattern, which forms a resist film image having a width smaller than 20 nm by exposure on the substrate, is not transferred to the resist film. Since in the case of FIG. 10, the width of the resist film obtained by exposure was 20 nm, then a condition that the auxiliary pattern was not transferred to the resist film was defined such that the auxiliary pattern is smaller than 68 nm.

However, it is possible to set a width of the auxiliary pattern to be greater than the above auxiliary pattern width, by contriving a method of disposing an auxiliary pattern. For example, in the above example, it is possible to introduce advantageous effects of the auxiliary pattern by gradually reducing the size of the auxiliary pattern as the line patterns 11 and 12 come close to portions at which periodicity is lost, though the design of the auxiliary pattern becomes slightly complicated.

Next, with regard to a relationship between the space width St and the auxiliary pattern width Sw, the inventors of the present application performed simulations to obtain a specific disposition condition that the auxiliary pattern cannot not be transferred and the exposure margins of the adjacent pattern and its further adjacent pattern can be improved, where the space width St between the auxiliary pattern and its adjacent pattern is applied as a parameter St, and is given by St=(Sc−Sw)/2, see FIG. 8.

FIG. 12 shows a relationship between the width Sw of an auxiliary pattern and the space distance St between the auxiliary pattern and its adjacent pattern to improve an exposure margin of the above-described adjacent pattern. The width Sw and the space distance St were indicated by being normalized based on the numerical aperture NA and wavelength λ of the exposure apparatus. In FIG. 12, plots indicate results of Sw and St obtained by the above exposure simulation. The solid line indicates a relationship between Sw and St obtained from the result. However, with respect to the above simulation result, in actual exposure, it is believed that variation in order of ±0.06 is found at a value normalized by λ/NA depending on an exposure device to be used or a resist process performance to be used. In FIG. 12, two broken lines indicate variation of ±0.06 at a value normalized at λ/NA with respect to the above solid line.

In the graph of FIG. 12, it is found that a region D (i.e., a left-side region of the left-side broken line) is a region in which advantageous effect of the embodiment is attained. That is, in the region D, the auxiliary pattern is not transferred. On the other hand, in a region E (i.e., a right-side region of the right-side broken line), the auxiliary pattern is transferred, and thus, is a region in which disposition of an auxiliary pattern is not suitable. Further, a region F between the regions D and E is a region in which there is a high possibility that an auxiliary pattern is transferred in accordance with an exposure process to be used. If the transfer of the auxiliary pattern is suppressed in the region F, advantageous effect of oblique incidence exposure is greatly attained in the region F as compared with that in the region D. Thus, the improvement of an exposure margin can be expected with regard to the region F.

In addition, in a region B shown in FIG. 12 (in which Sw is equal to or greater than 0.37 in normalized dimensions), the auxiliary pattern is transferred without dependency on the space width St. On the other hand, in a region C shown in FIG. 12 (in which Sw is equal to or smaller than 0.25 in normalized dimensions), the width of the auxiliary pattern is small as compared with a cell size, and thus, a restriction on manufacturing a mask occurs.

From the foregoing, it is found that the auxiliary pattern width Sw may meet:

$$0.23 \leq Sw/(\lambda/NA) \leq 0.35 \quad (1)$$

and the space width St between the auxiliary pattern and its adjacent line pattern may meet:

$$St/(\lambda/NA) \geq 3.97 Sw - 0.74 \quad (2)$$

As described above, with the embodiment, regarding the problem that a pattern exposure margin is lowered in a non-periodic region of an actual device pattern, in particular, in a cell pattern, especially, in a region where patterns having a plurality of periodicities are adjacent to each other, attention is focused only to the space width St between the auxiliary pattern and its adjacent pattern (i.e., a target pattern whose margin is to be improved), and the auxiliary pattern width Sw and the space width St are set so as to meet Formulae (1) and (2), thereby making it possible to set an auxiliary pattern capable of achieving the improvement of an exposure margin.

In this manner, with respect to a non-periodic pattern in a cell pattern in which a sufficient exposure margin is not successfully obtained conventionally, remarkable improvement of the exposure margin is achieved due to the advantageous effect of an un-transferable auxiliary pattern.

While the embodiment has primarily described a mask on which an auxiliary pattern has been disposed, it is possible to apply the embodiment to the mask pattern data generating method. That is, determination is made as to whether or not an auxiliary pattern can be disposed on a line pattern as a target from a relationship between the width Sw of the auxiliary pattern and the space width St between the auxiliary pattern and its adjacent pattern, by using the above Formulae 1 and 2, making it possible to generate the auxiliary pattern.

Second Embodiment

Hereinafter, a second embodiment describes that a technique of disposing an auxiliary pattern used in the first embodiment can be applied to a region of a complicated pattern shown in FIG. 13.

Figure 14:
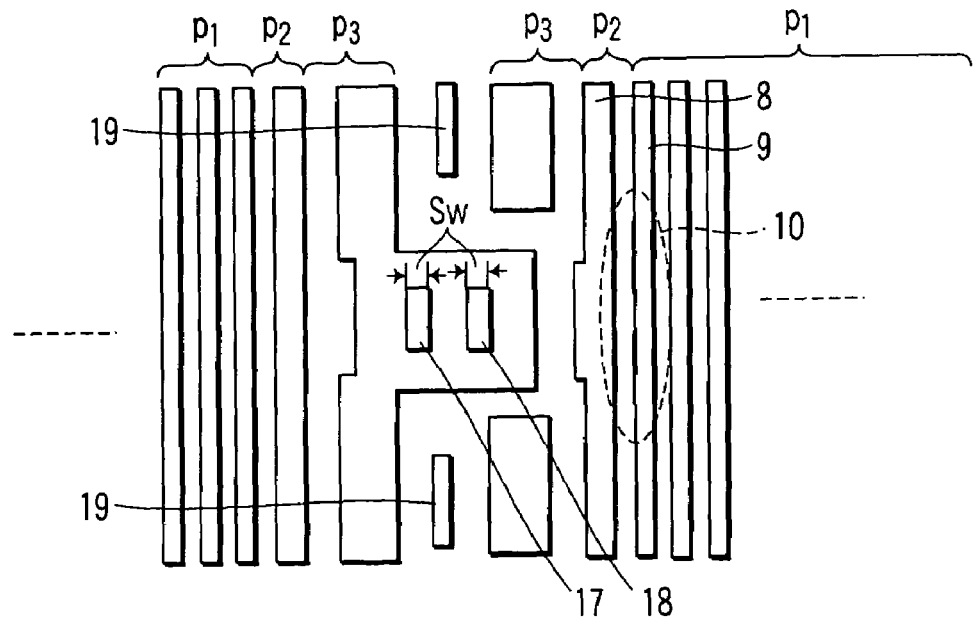
FIG. 14 is a diagram showing a pattern obtained by adding auxiliary patterns 17, 18, and 19 to the design pattern shown in FIG. 13.
Figure 15:
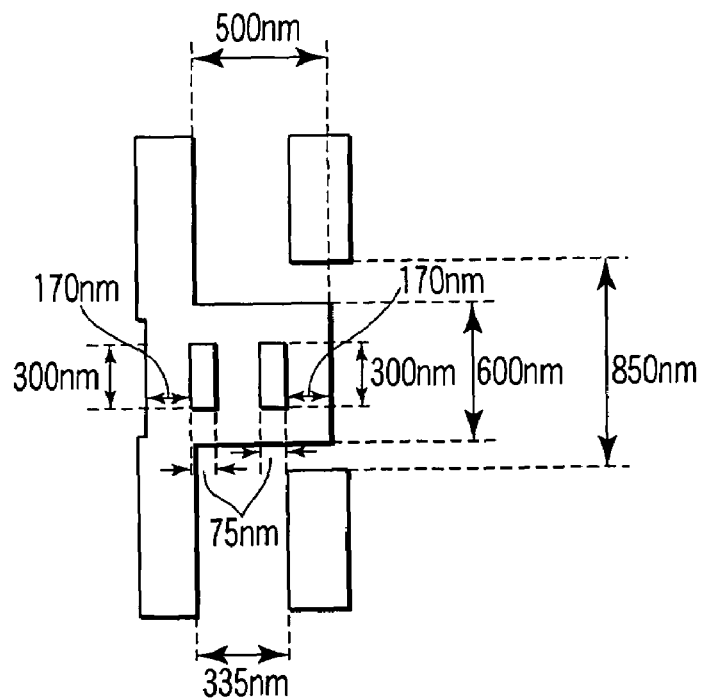
FIG. 15 is a diagram showing a part of the pattern shown in FIG. 14, in which numerical dimensions are added.

Regarding the pattern region shown in FIG. 13, an auxiliary pattern is disposed, as shown in FIGS. 14 and 15, based on the relation shown in formulae (1) and (2).

In FIG. 14, reference numerals 17 and 18 each designate an auxiliary pattern (i.e., a pattern forming a transmitting section). In addition, reference numeral 19 denotes an auxiliary pattern of 70 nm in width. FIG. 15 shows a portion of FIG. 14, detailed numerical dimensions being added. An exposure condition and patterns of the regions p1 to p3 are the same as those according to the first embodiment.

The inventors of the present application disposed auxiliary patterns 17 and 18 so as to meet formulae (1) and (2), while the dimensions in the short edge direction of the auxiliary patterns 17 and 18 are defined as Sw, as shown in FIG. 14.

Figure 16:
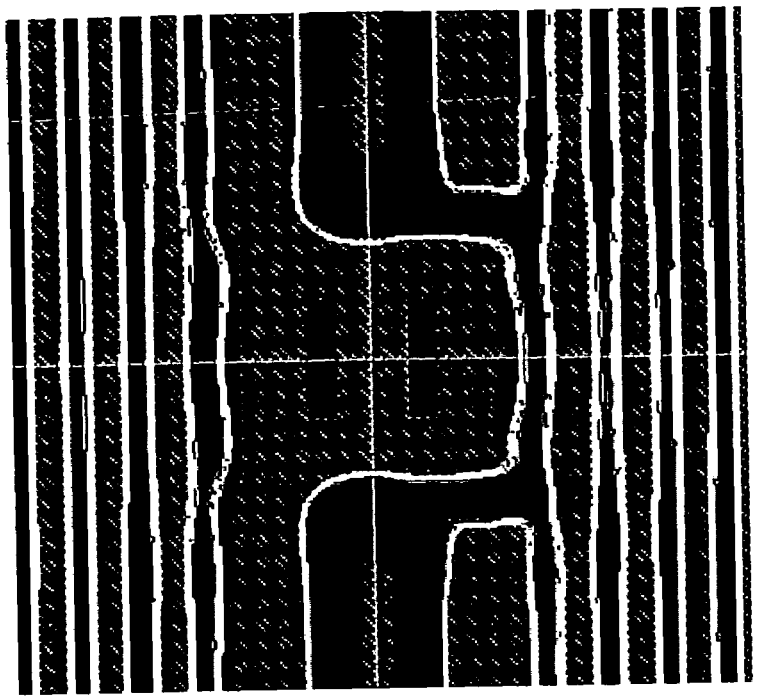
FIG. 16 shows a simulation image of a resist pattern obtained by transferring the pattern shown in FIG. 13.
Figure 17:
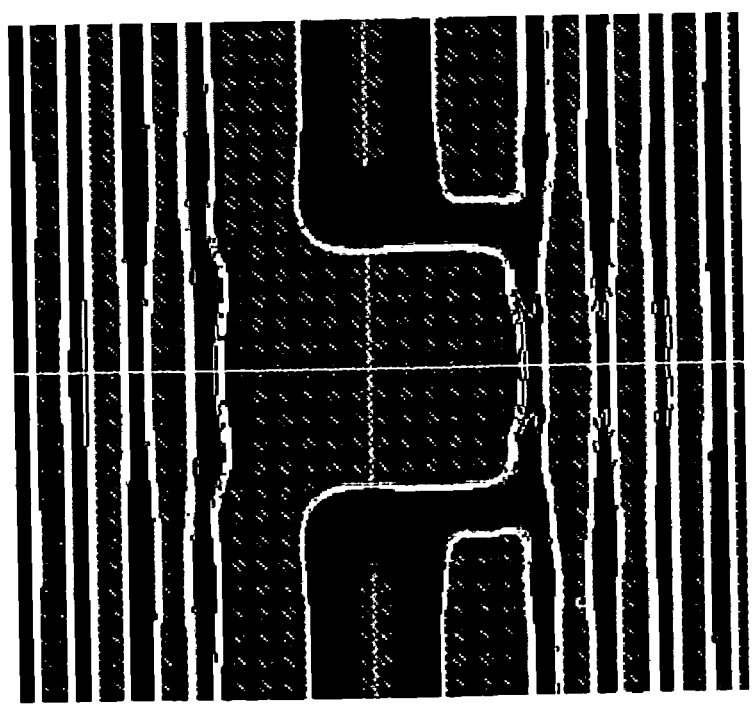
FIG. 17 shows a simulation image used as a reference to the simulation image shown in FIG. 16, the simulation image of the resist pattern being obtained by transferring the pattern shown in FIG. 13 when the auxiliary patterns 17 and 18 are not added.

FIG. 16 shows a resist pattern image of the mask pattern shown in FIGS. 14 and 15, obtained by simulation. For comparison with the resist pattern image shown in FIG. 16, FIG. 17 shows a resist pattern image of the mask pattern shown in FIGS. 14 and 15, in the case where the auxiliary patterns 17 and 18 are not disposed. The white solid line indicates a resist pattern image at an exposure dose of Just dose ±10%, Just dose denoting a dose by which L/S=70 nm/70 nm is obtained so that the cell portion of the region p1 is desirably formed at Just Focus and thus as designed.

From the resist pattern images shown in FIGS. 16 and 17, it has been confirmed that the disposed auxiliary patterns 17 and 18 meet a condition that the auxiliary patterns 17 and 18 are not transferred. Moreover, due to advantageous effect of the auxiliary pattern, the line pattern 8 and the line pattern 9 shown in FIG. 13, in particular, a pattern in a region 10 of these line patterns 8 and 9 can be formed without short-circuiting, and the exposure margin has been remarkably improved.

As described above, to cope with a problem with exposure margin degradation of a pattern in an non-periodic region of an actual device pattern, in particular, in a cell pattern, especially, in a region where a plurality of patterns having a plurality of periodicities are adjacent to each other, according to the second embodiment, while the short edge direction dimensions of the auxiliary pattern width disposed in a complicated pattern region in a two-dimensional manner are defined as Sw, attention is focused on only the auxiliary pattern width Sw and the space width St between the auxiliary pattern and the adjacent pattern (i.e., a target pattern whose margin is to be improved), and the auxiliary pattern width Sw and the space width St are set so as to meet the above formulae (1) and (2), thereby making it possible to set an auxiliary pattern capable of achieving the improvement of the exposure margin. In this manner, with respect to the non-periodic pattern in the cell pattern as well, in which a sufficient exposure margin has not been successfully obtained, remarkable improvement of the exposure margin can be achieved due to advantageous effect of an auxiliary pattern whose image is not transferred.

While each of the above embodiments has described a mask on which an auxiliary pattern has been disposed, the mask can be used in manufacturing a semiconductor device.

The embodiments can be applied to a method of generating mask pattern data. That is, determination is made as to whether or not an auxiliary pattern can be disposed on a line pattern as a target from a relationship between the width Sw of the auxiliary pattern and the space width St between the auxiliary pattern and its adjacent pattern, by using the above Formulae (1) and (2), making it possible to generate the auxiliary pattern.

A photo mask can be manufactured by using the mask pattern data generated by using the mask pattern data generating method described in each of the above embodiments. In addition, the manufactured photo mask can be used in manufacturing a semiconductor device. A sufficient exposure margin can be obtained by using the manufactured photo mask, thus improving the yield of the semiconductor device. It is preferable that the mask pattern data generating method described in each of the embodiments is applied to a design pattern of a semiconductor device or a liquid crystal display to generate a pattern for manufacturing a photo mask. Then, the manufactured photo mask for manufacturing the semiconductor device and the manufactured photo mask for manufacturing the liquid crystal display are radiated in use by the oblique incidence illumination system to project the patterns formed on the photo mask on a resist pattern formed on the substrate.

In each of the above embodiments, an auxiliary pattern is disposed to a design pattern. However, without being limited thereto, an auxiliary pattern may be disposed to a design pattern in which optical proximity effect correction and/or process proximity effect correction has been carried out.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A mask pattern data generating method of generating mask pattern data of a mask pattern to be depicted on a photo mask, based on a design pattern, for use in projection by an oblique incidence illumination, the method comprising:

preparing mask pattern data which corresponds to a design pattern including a pair of line patterns formed of two line patterns adjacent to each other in a short edge direction; and disposing an auxiliary pattern which is un-transferable to a resist film at a center portion of a space region between the pair of line patterns, in which the disposing of the auxiliary pattern includes obtaining a shape of the auxiliary pattern which meets formulae in which a width in the short edge direction of the auxiliary pattern, a space width between the auxiliary pattern and one of the pair of line patterns, a wavelength of an exposure light emitted by a projection aligner using a photo mask at exposure, and a numerical aperture of a projection lens of the projection aligner are defined as parameters, and disposing the obtained auxiliary pattern at the center portion of the space region between the pair of line patterns, wherein, when the width in the short edge direction of the auxiliary pattern converted to the dimensions on the resist film is defined as Sw (nm), the space width converted to the dimensions on the resist film is defined as St [nm], the wavelength of the exposure light is defined as λ [nm], and the numerical aperture is defined as NA, the formulae are:

$$0.23 \leq Sw/(\lambda/NA) \leq 0.35$$

$$St/(\lambda/NA) \geq 3.97Sw - 0.74.$$

2. A mask pattern data generating method according to claim 1, wherein the design pattern is a device pattern including a cell array region in which a plurality of line patterns are arrayed at a plurality of pitches in the short edge direction, and the auxiliary pattern is disposed in a space region of a line pattern disposed without periodicity in the cell array region, and the line pattern disposed without periodicity is a line pattern whose exposure margin is smaller than an exposure margin of a plurality of line patterns arranged with periodicity at a smallest pitch in the cell array region.

3. A mask pattern data generating method according to claim 2, wherein the plurality of line patterns arranged with periodicity at the smallest pitch are patterns corresponding to a plurality of memory cells connected in series of a NAND type flash memory.

4. A mask pattern data generating method according to claim 1, wherein the space region between the pair of line patterns corresponds to a space region between select gates of the NAND type flash memory adjacent to each other.

5. A mask pattern data generating method according to claim 1, wherein the exposure light emitted by a projection aligner is an ArF excimer laser beam, the wavelength λ of the exposure light is λ=193 nm, and the numerical aperture NA of the projection lens is NA=0.83.

6. A mask pattern data generating method according to claim 1, wherein the design pattern is a device pattern including a cell array region in which a plurality of line patterns are arranged at a plurality of pitches in the short edge direction, and
the auxiliary pattern is disposed in a region of the cell array region, in which region a periodicity of a pitch of the line patterns is lost and which region is adjacent to a region at which an exposure margin is smaller than an exposure margin at a region in which a pitch of line patterns is smallest in the cell array region.

7. A mask pattern data generating method according to claim 1, wherein the design pattern is a device pattern including a cell array region in which a plurality of line patterns are arrayed at a plurality of pitches in the short edge direction, and
the width of the auxiliary pattern is greater than a design rule of a cell portion in which a plurality of line patterns are arranged with periodicity at a smallest pitch in the cell array region.

8. A photo mask manufacturing method of manufacturing a photo mask by using mask pattern data, in which the mask pattern data corresponds to a design pattern including a pair of line patterns formed of two line patterns adjacent to each other in a short edge direction; the mask pattern data is added with an auxiliary pattern which is un-transferable to a resist film; the auxiliary pattern is disposed at a center portion of a space region between the pair of line patterns; and the auxiliary pattern has a shape which meets formulae in which a width in the short edge direction of the auxiliary pattern, a space width between the auxiliary pattern and one of the pair of line patterns, a wavelength of an exposure light emitted by a projection aligner using a photo mask at exposure, and a numerical aperture of a projection lens of the projection aligner are defined as parameters, wherein, when the width in the short edge direction of the auxiliary pattern converted to the dimensions on the resist film is defined as Sw (nm), the space width converted to the dimensions on the resist film is defined as St [nm], the wavelength of the exposure light is defined as λ [nm], and the numerical aperture is defined as NA, the formulae are:

$0.23 \leq Sw/(\lambda/NA) \leq 0.35$ $St/(\lambda/NA) \geq 3.97 Sw - 0.74.$

9. A photo mask manufacturing method according to claim 8, wherein the design pattern is a device pattern including a cell array region in which a plurality of line patterns are arrayed at a plurality of pitches in the short edge direction, and
the auxiliary pattern is disposed in a space region of a line pattern disposed without periodicity in the cell array region, and the line pattern disposed without periodicity is a line pattern whose exposure margin is smaller than an exposure margin of a plurality of line patterns arranged with periodicity at a smallest pitch in the cell array region.

10. A photo mask manufacturing method according to claim 9, wherein the plurality of line patterns arranged with periodicity at the smallest pitch are patterns corresponding to a plurality of memory cells connected in series of a NAND type flash memory.

11. A photo mask manufacturing method according to claim 8, wherein the space region between the pair of line patterns corresponds to a space region between select gates of the NAND type flash memory adjacent to each other.

12. A photo mask manufacturing method according to claim 8, wherein the exposure light emitted by a projection aligner is an ArF excimer laser beam, the wavelength λ of the exposure light is λ=193 nm, and the numerical aperture NA of the projection lens is NA=0.83.

13. A photo mask manufacturing method according to claim 8, wherein the design pattern is a device pattern including a cell array region in which a plurality of line patterns are arrayed at a plurality of pitches in the short edge direction, and
the width of the auxiliary pattern is greater than a design rule of a cell portion in which a plurality of line patterns are arranged with periodicity at a smallest pitch in the cell array region.

14. A semiconductor device manufacturing method of manufacturing a semiconductor device, by carrying out an oblique incidence illumination to a photo mask to project a pattern formed on the photo mask to a resist film formed on a substrate, in which
the photo mask is manufactured by using mask pattern data corresponding to a design pattern including a pair of line patterns formed of two line patterns adjacent to each other in a short edge direction; the mask pattern data is added with an auxiliary pattern which is un-transferable to a resist film; the auxiliary pattern is disposed at a center portion of a space region between the pair of line patterns; and the auxiliary pattern has a shape which meets formulae in which a width in the short edge direction of the auxiliary pattern, a space width between the auxiliary pattern and one of the pair of line patterns, a wavelength of an exposure light emitted by a projection aligner using a photo mask at exposure, and a numerical aperture of a projection lens of the projection aligner are defined as parameters wherein, when the width in the short edge direction of the auxiliary pattern converted to the dimensions on the resist film is defined as Sw (nm), the space width converted to the dimensions on the resist film is defined as St [nm], the wavelength of the exposure light is defined as λ [nm], and the numerical aperture is defined as NA, the formulae are:

$0.23 \leq Sw/(\lambda/NA) \leq 0.35$ $St/(\lambda/NA) \geq 3.97 Sw - 0.74.$

15. A semiconductor device manufacturing method according to claim 14, wherein the design pattern is a device pattern including a cell array region in which a plurality of line patterns are arrayed at a plurality of pitches in the short edge direction, and
the auxiliary pattern is disposed in a space region of a line pattern disposed without periodicity in the cell array region, and the line pattern disposed without periodicity is a line pattern whose exposure margin is smaller than an exposure margin of a plurality of line patterns arranged with periodicity at a smallest pitch in the cell array region.

16. A semiconductor device manufacturing method according to claim 15, wherein the plurality of line patterns arranged with periodicity at the smallest pitch are patterns corresponding to a plurality of memory cells connected in series of a NAND type flash memory.

17. A semiconductor device manufacturing method according to claim 14, wherein the semiconductor device is a NAND type flash memory.

18. A semiconductor device manufacturing method according to claim 14, wherein the space region between the pair of line patterns corresponds to a space region between select gates of the NAND type flash memory adjacent to each other.

19. A semiconductor device manufacturing method according to claim 14, wherein the exposure light emitted by a projection aligner is an ArF excimer laser beam, the wavelength $\lambda$ of the exposure light is $\lambda=193$ nm, and the numerical aperture NA of the projection lens is NA=0.83.

20. A semiconductor device manufacturing method according to claim 14, wherein the design pattern is a device pattern including a cell array region in which a plurality of line patterns are arrayed at a plurality of pitches in the short edge direction, and the width of the auxiliary pattern is greater than a design rule of a cell portion in which a plurality of line patterns are arranged with periodicity at a smallest pitch in the cell array region.

* * * * *